United States Patent
Sun et al.

(10) Patent No.: US 8,455,372 B2
(45) Date of Patent: Jun. 4, 2013

(54) METHOD FOR CLEANING AND PASSIVATING GALLIUM ARSENIDE SURFACE AUTOLOGOUS OXIDE AND DEPOSITING AL2O3 DIELECTRIC

(75) Inventors: Qingqing Sun, Shanghai (CN); Runchen Fang, Shanghai (CN); Wen Yang, Shanghai (CN); Pengfei Wang, Shanghai (CN); Wei Zhang, Shanghai (CN)

(73) Assignee: Fudan University, Shanghai (CN)

( * ) Notice: Subject to any disclaimer, the term of this patent is extended or adjusted under 35 U.S.C. 154(b) by 0 days.

(21) Appl. No.: 13/528,509

(22) Filed: Jun. 20, 2012

(65) Prior Publication Data

US 2013/0078819 A1    Mar. 28, 2013

(30) Foreign Application Priority Data

Sep. 23, 2011  (CN) .......................... 2011 1 0285677

(51) Int. Cl.
*H01L 21/31* (2006.01)
*H01L 21/00* (2006.01)
*C30B 28/06* (2006.01)

(52) U.S. Cl.
USPC ............. 438/779; 438/958; 438/906; 438/38; 117/950; 117/102; 117/104; 117/105; 427/255.11; 427/299; 257/E21.28

(58) Field of Classification Search
USPC .... 438/38, 745, 906, 958, 778, 779; 134/902; 257/E21.28; 117/102, 104, 105, 950; 427/255.11, 299
See application file for complete search history.

(56) References Cited

U.S. PATENT DOCUMENTS

| | | | | |
|---|---|---|---|---|
| 5,616,947 A | * | 4/1997 | Tamura | 257/410 |
| 5,933,705 A | * | 8/1999 | Geels et al. | 438/26 |
| 2004/0099889 A1 | * | 5/2004 | Frank et al. | 257/288 |
| 2008/0131601 A1 | * | 6/2008 | Kim et al. | 427/255.28 |

OTHER PUBLICATIONS

Lu et al. "A sulfur passivation for GaAs surface by an organic molecular, CH3CSNH2 treatment", Appl. Phys. Lett., vol. 69, No. 15, 1996, pp. 2282-2284.*
Huang et al. "Surface passivation of III-V compound semiconductors using atomic-layer-deposition-grown Al2O3", Appl. Phys. Lett., vol. 87, 2005, pp. 252104 1-3.*
Lin et al. "Leakage current and breakdown electric-field studies on ultrathin atomic-layer-deposited Al2O3 on GaAs", Appl. Phys. Lett., vol. 87, 2005, pp. 182904 1-3.*

* cited by examiner

*Primary Examiner* — Mary Wilczewski
*Assistant Examiner* — Erik T Peterson
(74) *Attorney, Agent, or Firm* — Jenkins, Wilson, Taylor & Hunt, P.A.

(57) ABSTRACT

The present invention belongs to the technical field of semiconductor materials and specifically relates to a method for cleaning and passivizing gallium arsenide (GaAs) surface autologous oxide and depositing an $Al_2O_3$ dielectric. This method includes: use a new-type of sulfur passivant to react with the autologous oxide on the GaAs surface to clean it and generate a passive sulfide film to separate the GaAs from the outside environment, thus preventing the GaAs from oxidizing again; further cleaning the residuals such as autologous oxides and sulfides on the GaAs surface through the pretreatment reaction of the reaction source trimethyl aluminum (TMA) of the $Al_2O_3$ ALD with the GaAs surface, and then deposit high-quality $Al_2O_3$ dielectric through ALD as the gate dielectric which fully separates the GaAs from the outside environment. The present invention features a simple process and good effects, and can provide preconditions for manufacturing the GaAs devices.

2 Claims, 3 Drawing Sheets

US 8,455,372 B2

METHOD FOR CLEANING AND PASSIVATING GALLIUM ARSENIDE SURFACE AUTOLOGOUS OXIDE AND DEPOSITING AL2O3 DIELECTRIC

CROSS-REFERENCE TO RELATED APPLICATION

This application is a continuation of and claims priority to Chinese Patent Application No. CN201110285677.0 filed on Sep. 23, 2011, the entire content of which is incorporated by reference herein.

BACKGROUND OF THE INVENTION

1. Technical Field

The present invention relates to the technical field of semiconductor materials and specifically to a method for cleaning & passivating gallium arsenide (GaAs) surface autologous oxide and depositing $Al_2O_3$ dielectric.

2. Description of Related Art

With the fast development of the microelectronics industry and optoelectronics industry, demands on semiconductor lasers, optical receivers used in fiber optic communications, and high-speed & high-frequency semiconductor devices made of III-V compound semiconductor materials such as GaAs have increased, so studies on III-V compound semiconductor materials such as GaAs are always a focus in the academic as well as industrial fields. Due to its high electron mobility, big forbidden bandwidth (1.43 eV) and low charge carrier concentration, GaAs intrinsic material is widely used in high-speed devices and high-temperature environments. GaAs are believed to be the best possible channel material that could replace silicon (Si) for the CMOS device in the Post-Silicon era. However, due to exposure to the air, GaAs tends to be oxidized into a series of complicated oxides and arsenic elementary substances, which causes many surface defects in the GaAs material and makes it unusable in microelectronic and optoelectronic devices. For a long time, the incapability of manufacturing GaAs with a clean surface and lack of proper dielectric material for passivizing GaAs were the two major problems that impede the large-scale application of GaAs material.

In the 1960s and 1970s, in accordance with the idea of oxidating Si to produce high-quality $SiO_2$ film, researchers made a lot of efforts to study how to use the autologous oxide of GaAs as a passivation dielectric, but all failed. Through in-depth research, it was found that the oxide of arsenic is unstable and that the density of the interfacial states between the autologous oxide layer and GaAs is quite high, which plays a role as the scattering center and nonradiative recombination center for charge carriers, reduces the mobility of charge carrier, and causes Fermi level pinning, thus seriously affecting the electrical and optical properties of devices.

After the regular cleaning of GaAs, the GaAs surface autologous oxide cannot be completely cleaned, and after cleaning, the GaAs sample will be inevitably exposed to the air before the next process. The clean GaAs surface has active chemical properties, and the surface of the GaAs sample will have the following reactions with the oxygen in the air:

$$3O_2+2GaAs=As_2O_3+Ga_2O_3 \quad (1)$$

$$4O_2+2GaAs=As_2O_5+Ga_2O_3 \quad (2)$$

$$As_2O_3+2GaAs=Ga_2O_3+4As \quad (3)$$

$$3As_2O_5+10GaAs=5Ga_2O_3+16As \quad (4)$$

Therefore, various components such as $Ga_2O_3$, $As_2O_3$ and As will be generated on the GaAs surface.

In 1987, Sandroff et al first proposed the sulfur passivation method for passivating GaAs surface with a sulfide solution. They passivized an $Al_xGa_{1-x}As$/GaAs heterojunction bipolar transistor (HBT) device with $Na_2S.9H_2O$ solution, thus the HBT low-current amplification factor was increased 60 times, and after passivation, the photoluminescence (PL) intensity is increased 250 times. The mechanism of the wet process of sulfur passivation is to generate a dense passivation layer mainly composed of $Ga_xS_y$ and $As_xS_y$ through chemical reaction of the $S^{2-}$ ions with the GaAs autologous oxide and arsenic elementary substance. The sulfur passivation method can effectively remove the unstable oxide from the surface and generate a sulfide layer, which can also inhibit the surface from being oxidized again, reduce the surface state density and surface recombination rate, and basically achieving the effect of reducing the surface state density (electrical passivation) and increasing stability (chemical passivation). In recent years, various sulfur passivation methods for GaAs materials have been invented and adopted, which have significantly improved the surface properties of GaAs.

In general, the $(NH_4)_2S$ passivation solution capable of generating a large amount of $S^{2-}$ and HS– ions is used for GaAs. However, due to its fast speed of reaction, it will cause severe corrosion to the surface of GaAs and generate many pits. Moreover, the water in the solution will cause the reoxidation of GaAs in the presence of oxygen, and the generated sulfide layer will be thin, which is disadvantageous to the follow-up procedures. A clean and oxygen-free GaAs substrate surface is the precondition for developing high-quality films. In view of this, the mixture of $CH_3CSNH_2$, ethanol and gradually hydrolyzed ammonia water is used to generate $HS^-$ and $S^{2-}$ ions so as to passivize the GaAs surface and generate a denser and thicker layer of sulfide which will separate the GaAs from the outside environment. Since the relative dielectric coefficient of alcoholic solution is much lower than that of water, the electrostatic adsorption capacity of $HS^-$ and $S^{2-}$ ions and the GaAs surface is increased. The alkaline environment of ammonia water (PH>7) can promote the generation of $HS^-$ and $S^{2-}$ ions through hydrolysis, which will help the S form covalent bonds with the GaAs surface atoms, thus the passivized GaAs surface has a lower density of interfacial states and less corroded pits.

Although sulfur passivation has eliminated most autologous oxides and elementary arsenic substances on the GaAs surface, the sulfides generated through passivation, especially As—S will still form a new defect level in the GaAs forbidden band, thus the Fermi level pinning on the GaAs surface still cannot be eliminated. Under a temperature of about 350C, the As—S bond will decompose and disengage from the GaAs surface, while the Ga—S bond is still stable under the temperature of 460 C. On the other hand, in the atomic layer deposition (ALD) process, self-cleaning occurred on the reaction source and the deposited substrate surface was gradually recognized and utilized, which refers to the reaction between the reaction source absorbed on the substrate surface and the oxide on the substrate, and in this way, substances such as oxides on the substrate will be cleaned. The present invention uses the chemical reaction of trimethyl aluminum (TMA) with $As_xS_y$, $Ga_xS_y$, $As_xO_y$, $Ga_xO_y$ and As as well as the thermal effect in the ALD process to make the residual sulfide and autologous oxide volatilize and disengage from the GaAs surface, so that a clean substrate surface can be obtained before deposition of the $Al_2O_3$ film dielectric.

In accordance with Moore's Law, with continuous reduction of the device size, the working speed will increase and power consumption will also reduce. The trend of continuous reduction of the device size is also reflected on the decrease of the gate oxide layer thickness ($T_{ox}$) of the metal-oxide-semiconductor field effect transistor ($MOSFET_s$). Because quantum tunneling will cause the grid leakage current to have an exponential rise with the decrease of the gate oxide thickness, when the gate oxide thickness is less than 2 nm, quantum tunneling will cause a fast increase of grid leakage currents, which will ultimately cause performance degradation of the device.

In accordance with the capacitance formula of parallel plate capacitors $$C = \frac{\varepsilon_r \cdot \varepsilon_o \cdot S}{t},$$

in order to increase the capacitance density of grid capacitors, materials with a higher dielectric constant (high-k material) can be used to replace conventional $SiO_2$ as the gate dielectrics. Obviously, in order to obtain the same grid capacitance, corresponding thicknesses of $SiO_2$ and high-k material should satisfy the following relation:

$$\frac{t_{high-k}}{t_{SiO_2}} = \frac{\varepsilon_{high-k}}{\varepsilon_{SiO_2}}$$

Where, $t_{high-k}$, $t_{SiO_2}$, $\varepsilon_{high-k}$ and $\varepsilon_{SiO_2}$ represent the film thickness of high-k material, the thickness of $SiO_2$ film, and the dielectric constants of high-k material and the dielectric constant of $SiO_2$ respectively. Under a certain capacitance density of the grid capacitor, the leakage current has significantly reduced after using high-k material as the gate dielectric compared to silica.

Among various high-k materials, from the perspective of material properties and electrical properties, $Al_2O_3$ is a high-quality dielectric material. $Al_2O_3$ has high a forbidden bandwidth (~9 eV), high breakdown field strength (5-10 MV/cm) and great thermal stability, and can maintain an amorphous state after high-temperature processing and treatment. Materials such as $Al_2O_3$, Si and GaAs have stable interfaces, and $Al_2O_3$ has a good blocking effect toward sodium, boron and phosphorus, and also has strong radiation resistance capacity. Therefore, $Al_2O_3$ is often used as the passivation film and dielectric material, which can help increase and improve the performance and reliability of the device.

BRIEF SUMMARY OF THE INVENTION

The present invention aims at providing a method for cleaning & passivating GaAs surface autologous oxide, and further providing a method for depositing $Al_2O_3$ on it.

The content of the present invention includes:

1. Use a new-type of sulfur passivant to react with the autologous oxide on the GaAs surface to clean it and generate a sulfide passive film to separate the GaAs from the outside environment, thus preventing the GaAs from oxidating again.

2. Further clean the residuals such as autologous oxides and sulfides on the GaAs surface through the pretreatment reaction of the reaction source TMA of the $Al_2O_3$ ALD with the GaAs surface to obtain a very clean GaAs surface. Then deposit a high-quality $Al_2O_3$ dielectric through ALD as the gate dielectric, which fully separates the GaAs from the outside environment and provides preconditions for manufacturing the GaAs devices The present invention comprises of the following steps:

(1) After regular chemical cleaning, immediately put the GaAs sample into the prepared sulfur passivation solution which is made of 1-5 g of thioacetamide ($CH_3CSNH_2$), 1-4 ml of absolute ethyl alcohol ($CH_3COOH$) and 1-4 ml of ammonia water ($NH_3.H_2O$), the temperature of passivation reaction is 25 C-60 C, and the passivation time is 5-30 minutes.

(2) After passivation, rinse the GaAs sample for 10-60 seconds with deionized water, then purge the sample for 5-15 seconds with high-purity nitrogen, and then immediately put it into the ALD reaction chamber.

(3) Before developing an alumina ($Al_2O_3$) film dielectric, conduct TMA pretreatment reaction of the GaAs sample first, so as to further clean the sulfide and residual autologous oxide from the GaAs surface to obtain a clean GaAs surface, and the pretreatment condition includes: introduce the TMA gas to the ALD reaction chamber for 2-8 minutes and purge it for 10-60 seconds with the nitrogen.

(4) Develop a required high-quality $Al_2O_3$ film dielectric by the ALD method. The reaction sources are TMA and deionized water respectively, the temperature of deposition reaction is 250-350 C, the pressure in the reaction chamber is smaller than 15 torr, and the thickness of the oxide film is adjusted through control of the cycles of the atomic layer reaction. A single reaction cycle includes: introduce TMA gas for 1-5 seconds, purge it with nitrogen for 2-10 seconds, introduce deionized water vapor for 1-5 seconds and purge it with nitrogen for 2-10 seconds.

In the present invention, the optimized process conditions are:

The sulfur passivation solution is: composed of 2 g of thioacetamide, 4 ml of absolute ethyl alcohol and 1 ml of ammonia water, the temperature of passivation reaction is 25 C, and the passivation time is 10 minutes.

After passivation, rinse the GaAs sample for 10 seconds with deionized water, then purge the sample for 10 seconds with high-purity nitrogen, and then immediately put it into the ALD reaction chamber.

The pretreatment reaction condition of TMA and GaAs includes: introduce the TMA gas to the ALD reaction chamber for 5 minutes, and purge it for 30 seconds with the nitrogen.

Develop a required high-quality $Al_2O_3$ film dielectric with the ALD method. The reaction sources are TMA and deionized water respectively, the temperature of the deposition reaction is 300 C, and the pressure in the reaction chamber is 5 torr. A single reaction cycle includes: introduce TMA gas for 1.5 seconds, purge it with nitrogen for 3 seconds, introduce deionized water vapor for 1 second and purge it with nitrogen for 3 seconds.

The present invention method can be used for the GaAs surface cleaning and oxide deposition of the MES (metal-semiconductor) structure and MOS (metal-oxide-semiconductor) structure of the GaAs.

Further specific operating procedures of the present invention are:

(1) Firstly, put the GaAs sample in trichloroethylene, acetone, alcohol and deionized water successively to conduct ultrasonic cleaning for 4-8 minutes;

(2) After taking out the GaAs sample, put it into the HF solution ($HF/H_2O=\frac{1}{50}$) to rinse for 2-3 minutes so as to eliminate the oxide layer on the GaAs substrate surface.

(3) Then, put the GaAs sample in the ammonia water with a concentration of 10% to rinse for 4-6 minutes to remove the residual HF solution and the oxide layer on the GaAs surface.

(4) Take out the GaAs, and then immediately put it into the mixture of $CH_3CSNH_2$, ethanol and ammonia water to passivize it for 5-30 minutes so as to remove the oxide of GaAs and form a sulfur passivation layer.

(5) After passivation, use deionized water to rinse the GaAs sample for 8-15 seconds, and then blow-dry the sample with a high-purity $N_2$ gun.

(6) After sulfur passivation, put the GaAs sample into the ALD reaction chamber, and turn on the ALD device, after reaching the process conditions, introduce TMA gas to the ALD reaction chamber for 2-8 minutes, then turn off the TMA gas, and introduce nitrogen to the ALD reaction chamber for 10-60 seconds to purge the products and residuals of the pretreatment reaction.

(7) After the pretreatment of TMA and the GaAs sample, start deposition of the $Al_2O_3$ dielectric, and develop the required film thickness through control of the process conditions.

(8) After deposition of the $Al_2O_3$ dielectric, conduct rapid thermal annealing of the $Al_2O_3$/GaAs sample, and 1-5 minutes' healing in $N_2$ under the temperature of 300-600 C, thus the quality of the $Al_2O_3$ dielectric layer and the interfacial property of $Al_2O_3$/GaAs can be improved.

The present invention uses the reaction between the sulfur passivant and the autologous oxide on the GaAs surface to conduct chemical cleaning, and the pretreatment reaction of the reaction source TMA of the ALD method with GaAs to further clean the GaAs surface, which can generate high-quality $Al_2O_3$ dielectric to separate GaAs from the outside environment and provide preconditions for manufacturing the GaAs devices.

DETAILED DESCRIPTION OF THE INVENTION

The present invention will be further illustrated in conjunction with the embodiments hereinafter.

Embodiment 1

This experiment uses an n-type (100) crystal orientation GaAs sample doped with Si with a doping concentration of about $1.0 \times 10^{17}$ $cm^{-3}$. After cleaving the GaAs sample into small samples, successively add them into richloroethylene, acetone, alcohol and deionized water to conduct ultrasonic cleaning for 5 minutes so as to remove grease and organics from the surface. Then, put the GaAs sample in the diluted HF solution with a concentration of 2%, after 2 minutes of cleaning, rinse off the redundant HF solution with deionized water, thus rinsing off oxides from the GaAs surface. Then, soak it in ammonia water with a concentration of 10% for 5 minutes, and eliminate the oxide through the reaction between the alkali and the autologous oxide of GaAs; in addition, this step can also be used to neutralize the previous HF solution.

Prepare the mixture solution with 2 g of $CH_3CSNH_2$, 4 ml of absolute ethyl alcohol and 1 ml of ammonia water, use clean tweezers to take out the GaAs sample, immediately put it into the mixture solution to passivize it for 10 minutes, rinse off the oxide from the GaAs surface and form a dense sulfur passivation layer, and mark the treated sample as Sample A. As comparison, an $(NH_4)_2S$ passivation solution containing ethanol is also prepared composed of the mixture of 10% of $(NH_4)_2S$ and absolute ethyl alcohol in a proportion of 1:1, and the GaAs sample cleaned in the last step is also passivized for 10 minutes, and the treated sample is marked as Sample B.

Figure 1:
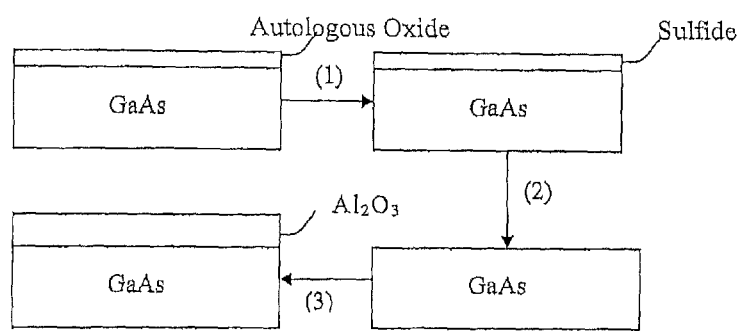
FIG. 1 is the process flow diagram of the present invention, wherein, (1)-sulfur passivation of GaAs, (2)-TMA pretreatment of GaAs, (3)-ALD $Al_2O_3$ dielectric.
Figure 2:
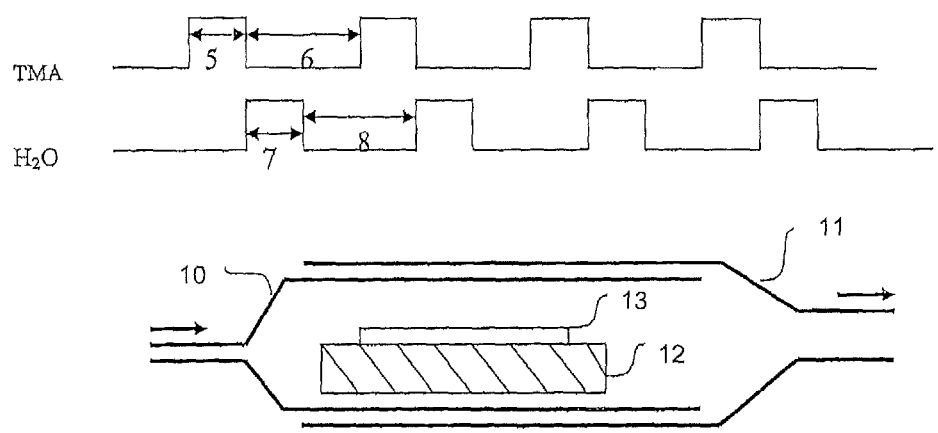
FIG. 2 is the process flow diagram of the deposition of $Al_2O_3$ dielectric by the GaAs sample in the ALD reaction chamber, wherein the diagram above is the deposition process flow control, while the diagram below is an illustration of the $Al_2O_3$ dielectric deposited on the GaAs sample.

After passivation, rinse the Sample A and Sample B for 10 seconds with deionized water, and then dry samples with dry $N_2$. Immediately put Sample A and Sample B into the ALD reaction chamber, and turn on the ALD device. After reaching the process conditions, introduce TMA gas to the ALD reaction chamber for 5 minutes, then turn off the TMA gas, and introduce nitrogen to the ALD reaction chamber for 30 seconds to purge the products of the reaction between TMA and GaAs. After the pretreatment of TMA and the GaAs sample, start deposition of the $Al_2O_3$ dielectric. TMA and water are used as the reaction source to control and develop required film thickness through change of deposition cycles. The specific process conditions are: the temperature in the reaction chamber is 300 C, and the pressure is <15 torr. As shown in FIG. 2, each cycle includes: introduce a TMA gas pulse (5) for 1.5 seconds, purge it with nitrogen for 3 seconds (6), introduce moisture for 1 second (7) and purge it with nitrogen for 3 seconds (8). Through the ALD method, a level atomic-scale surface can be obtained and the film deposited has great evenness and repeatability with a thickness capable of being accurately controlled. In FIG. 2, 10 represents the introduction channel for the reaction source and nitrogen, 11 represents the discharge channel for the reaction source and products, 12 represents the GaAs sample, and 13 represents the $Al_2O_3$ dielectric.

Material Result Analysis

Figure 3:
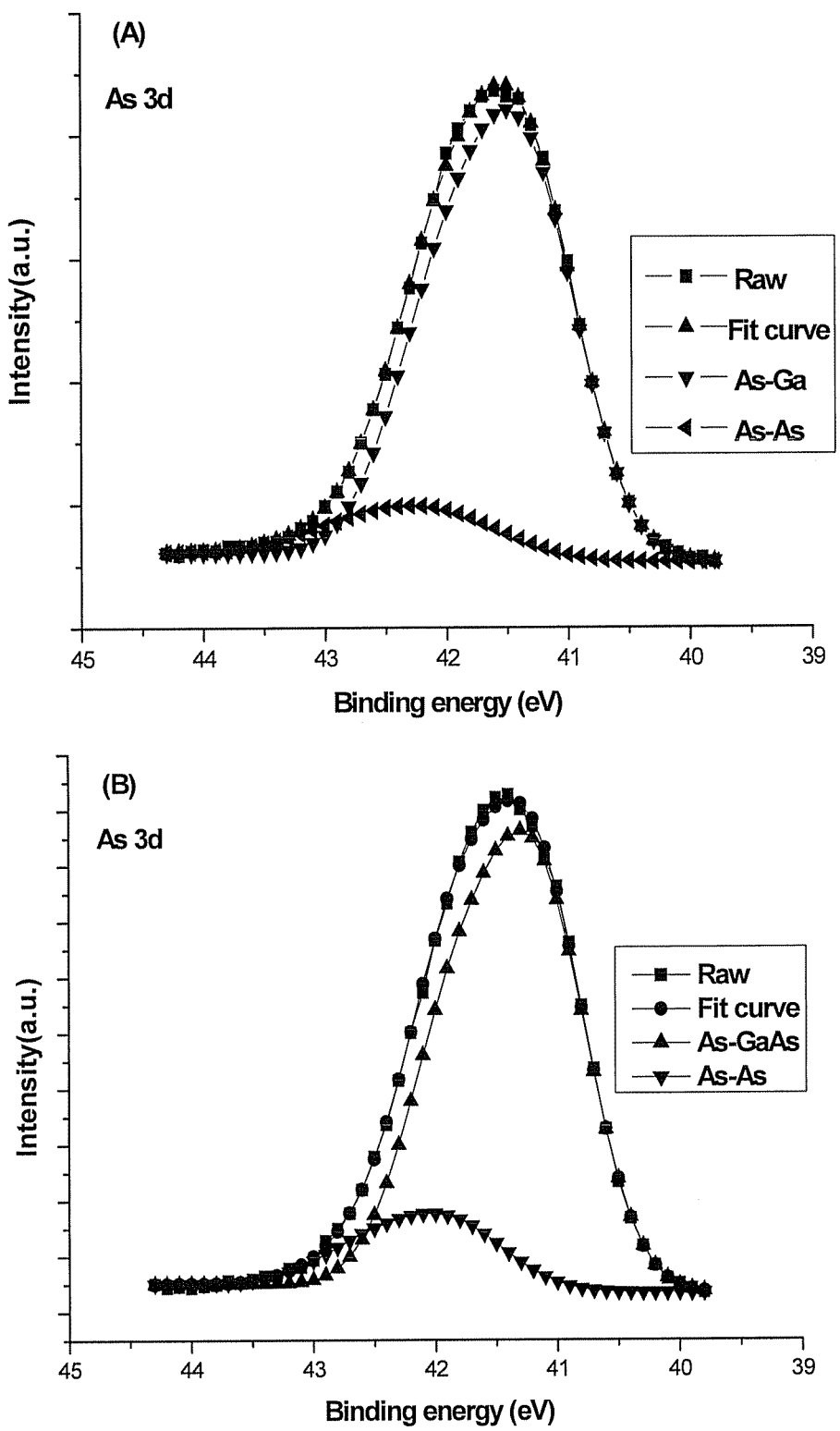
FIG. 3 is the photoelectron spectroscopy diagrams (XPS) of Sample A (thioacetamide passivation) and Sample B (ammonium sulfate passivation) of the $Al_2O_3$ dielectric after 60 cycles' deposition by using the ALD method, wherein the left diagram is the As 3d XPS peak of Sample A, while the right diagram is the As 3d XPS of Sample B.

FIG. 3 is the photoelectron spectroscopy diagrams (XPS) of Sample A (thioacetamide passivation) and Sample B (ammonium sulfate passivation) of the $Al_2O_3$ dielectric after 60 cycles' deposition by the ALD method. Table 1 shows the As 3d XPS peak fitting results of Sample A (the table above) and Sample B (the table below).

TABLE 1

| Fitting Peak | As—Ga | As—As |
|---|---|---|
| Central Peak (eV) | 41.3 | 42.1 |
| Proportion of Area | 89.13% | 10.87% |
| Central Peak (eV) | 41.2 | 42.0 |
| Proportion of Area | 86.24% | 13.76% |

As shown in FIG. 3 and Table 1, through comparison between Sample A and Sample B, the relative proportion of As—As (As elementary substance) is reduced, which means that the sample after thioacetamide passivation has a lower elementary substance arsenic content than that after ammonium sulfate passivation.

Figure 4:
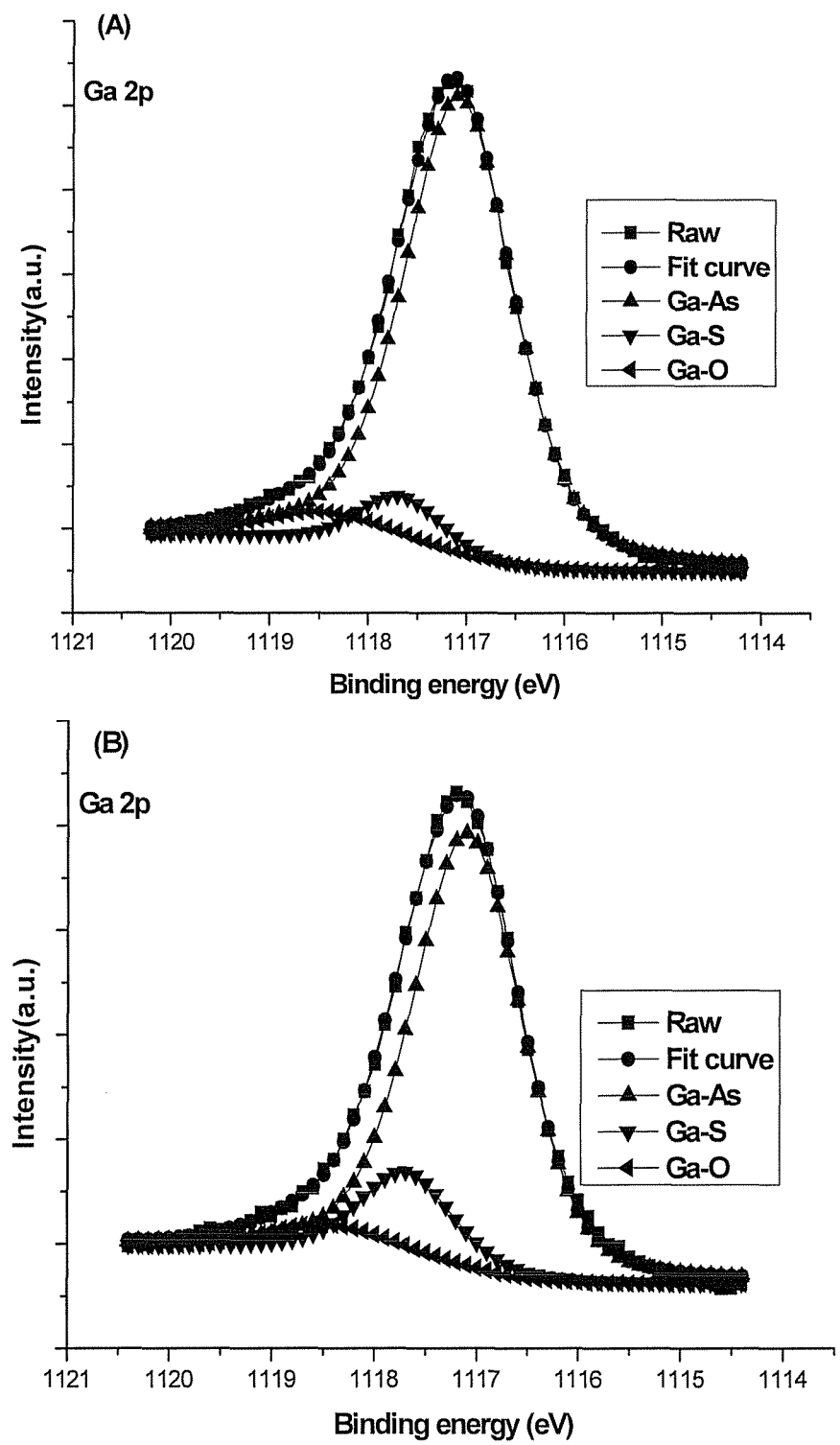
FIG. 4 is the Ga 2p XPS peaks of Sample A (thioacetamide passivation) (left diagram) and Sample B (ammonium sulfate passivation) (right diagram).

FIG. 4 is the Ga 2p XPS peaks of Sample A (thioacetamide passivation) (left diagram) and Sample B (ammonium sulfate passivation) (right diagram). Table 2 shows the Ga 2p XPS peak fitting results of Sample A (the table above) and Sample B (the table below).

TABLE 2

| Fitting Peak | Ga—As | Ga—S | Ga—O |
|---|---|---|---|
| Central Peak (eV) | 1117.1 | 1117.7 | 1118.5 |
| Proportion of Area | 89.95% | 5.54% | 4.50% |
| Central Peak (eV) | 1117.1 | 1117.7 | 1118.5 |
| Proportion of Area | 82.68% | 13.10% | 4.22% |

As shown in FIG. 4 and Table 2, through comparison between Sample A and Sample B, the relative proportion of Ga—S bond has significantly decreased, while we expect bigger component concentration of the Ga-AS bond. This means that the interfacial components of the sample after thioacetamide passivation mainly consist of Ga—As, which satisfies the requirement to reduce the density of interfacial states and to eliminate the Fermi level pinning.

What is claimed is:

1. A method for cleaning and passivating gallium arsenide (GaAs) surface autologous oxide and depositing $Al_2O_3$ dielectric, characterized in that it is comprised of the following steps:

(1) after regular chemical cleaning, immediately put the GaAs sample into the prepared sulfur passivation solution which is made of 1-5 g of thioacetamide, 1-4 ml of absolute ethyl alcohol and 1-4 ml of ammonia water, the temperature of passivation reaction is 25 C-60 C, and the passivation time is 5-30 minutes;

(2) after passivation, rinse the GaAs sample for 10-60 seconds with deionized water, then purge the sample for 5-15 seconds with high-purity nitrogen, and then immediately put it into the atomic layer deposition (ALD) reaction chamber;

(3) before developing the alumina film dielectric, conduct trimethyl aluminum (TMA) pretreatment of the GaAs sample first, and the pretreatment conditions are: introduce the TMA gas to the ALD reaction chamber for 2-8 minutes, and purge for 10-60 seconds with the nitrogen;

(4) develop a required high-quality $Al_2O_3$ film dielectric by the ALD method, the reaction sources are TMA and deionized water respectively, the temperature of the deposition reaction is 250-350 C, the pressure in the reaction chamber is smaller than 15 torr, and the thickness of the oxide film is adjusted through control of the cycles of the atomic layer reaction.

2. The method for cleaning and passivating GaAs surface autologous oxide and depositing $Al_2O_3$ dielectric according to claim 1, characterized in that a single reaction cycle in step (4) is successively: introduce TMA gas for 1-5 seconds, purge it with nitrogen for 2-10 seconds, introduce deionized water vapor for 1-5 seconds, and purge it with nitrogen for 2-10 seconds.

* * * * *